US008841201B2

(12) United States Patent
Teng et al.

(10) Patent No.: US 8,841,201 B2
(45) Date of Patent: Sep. 23, 2014

(54) SYSTEMS AND METHODS FOR POST-BONDING WAFER EDGE SEAL (71) Applicant: Taiwan Semiconductor Manufacturing Co., Ltd., Hsin-Chu (TW)

(72) Inventors: Yi-Chuan Teng, Zhubei (TW); Jung-Huei Peng, Jhubei (TW); Shang-Ying Tsai, Pingzhen (TW); Hsin-Ting Huang, Bade (TW); Lin-Min Hung, Longtan Township (TW); Yao-Te Huang, Hsinchu (TW); Chin-Yi Cho, Kaohsiung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 37 days.

(21) Appl. No.: 13/771,382

(22) Filed: Feb. 20, 2013

(65) Prior Publication Data
US 2014/0231967 A1    Aug. 21, 2014

(51) Int. Cl.
*H01L 21/46* (2006.01)
*H01L 29/06* (2006.01)
*H01L 21/18* (2006.01)

(52) U.S. Cl.
CPC ............. *H01L 21/185* (2013.01); *H01L 29/06* (2013.01)
USPC .......................................... 438/456; 438/459

(58) Field of Classification Search
USPC .................................. 438/456, 459
See application file for complete search history.

(56) References Cited

U.S. PATENT DOCUMENTS

| 5,618,380 | A  | * | 4/1997  | Siems et al. ................... 438/14 |
| 5,929,509 | A  | * | 7/1999  | Shen et al. .................... 257/620 |
| 6,965,107 | B2 | * | 11/2005 | Komobuchi et al. ........ 250/338.1 |
| 7,129,172 | B2 | * | 10/2006 | Morrow et al. ............... 438/690 |
| 8,633,088 | B2 | * | 1/2014  | Montez et al. ................ 438/456 |
| 8,647,962 | B2 | * | 2/2014  | Liu et al. ...................... 438/455 |
| 2003/0008478 | A1 | * | 1/2003 | Abe et al. ..................... 438/459 |
| 2004/0038448 | A1 | * | 2/2004 | Seo et al. ..................... 438/106 |
| 2006/0189099 | A1 | * | 8/2006 | Lu et al. ....................... 438/460 |
| 2007/0161149 | A1 | * | 7/2007 | Lin et al. ....................... 438/99 |
| 2008/0128885 | A1 | * | 6/2008 | Lee et al. ..................... 257/690 |
| 2008/0128901 | A1 | * | 6/2008 | Zurcher et al. .............. 257/724 |
| 2008/0138961 | A1 | * | 6/2008 | Lee ............................... 438/459 |
| 2009/0042363 | A1 | * | 2/2009 | Miyazaki et al. ............. 438/459 |
| 2010/0062584 | A1 | * | 3/2010 | Kurita et al. ................. 438/459 |
| 2010/0248414 | A1 | * | 9/2010 | Liu et al. ....................... 438/70 |
| 2011/0207294 | A1 | * | 8/2011 | Nakanishi et al. ........... 438/459 |
| 2012/0049312 | A1 | * | 3/2012 | Tanida et al. ................. 257/447 |
| 2012/0115305 | A1 | * | 5/2012 | Peng et al. .................... 438/455 |
| 2013/0237033 | A1 | * | 9/2013 | Nakanishi et al. ........... 438/459 |
| 2014/0042596 | A1 | * | 2/2014 | Alley et al. ................... 257/623 |

* cited by examiner

*Primary Examiner* — Yu-Hsi D Sun
*Assistant Examiner* — Grant Withers
(74) *Attorney, Agent, or Firm* — Eschweiler & Associates, LLC (57) ABSTRACT A method for fabricating a semiconductor device is disclosed. A first substrate is arranged over a second substrate. A wafer bonding process is performed on the semiconductor device. First regions of the device are enclosed by the bonding process. Second regions of the device remain exposed. One or more processes are performed on the exposed second regions, after performing the wafer bonding process. The one or more processes include a fill process that forms a fill material within the exposed second regions. An edge seal material is applied on the first and second substrates after performing the one or more processes.

20 Claims, 7 Drawing Sheets

SYSTEMS AND METHODS FOR POST-BONDING WAFER EDGE SEAL

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material. Silicon is an example of a typical semiconductor material used in the fabrication process, however other types of semiconductor materials can be utilized.

One process frequently used in semiconductor device fabrication is wafer edge seal ring formation. This process forms a wafer edge seal ring structure on the wafer to reduce particulate contaminants during wafer processing of integrated circuits. A wafer edge seal ring can formed by delimiting the deposition of layers at the peripheral edges of wafers. Each layer is deposited and then essentially trimmed back from the edge of the wafer through a judicious use of mask and etching, and/or edge-bead rinsing (EBR), and is later sealed by wafer edge exposure (WEE). Thus, abnormal growth of layers is prevented from building up into protrusions at the edge of the wafer. These abnormal layers can later peel or break up to form particulate matter and fine dust.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Generally, semiconductor fabrication involves performing a relatively large number or process steps on a wafer or semiconductor material in order to produce a desired semiconductor integrated circuit. The fabrication process is a multiple-step sequence of photolithographic and chemical processing steps during which electronic circuits are gradually created on a wafer composed of a semiconducting material.

The process steps can be broken down into front end of line (FEOL) processing and back end of line (BEOL) processing. In one example, over 300 sequenced process steps are required to form an integrated circuit on a semiconductor wafer.

Wafer edge rings are utilized in semiconductor devices to reduce particulate contaminants during fabrication or processing of the devices. Wafer edge rings are useful for relatively dense devices, such as integrated devices, micro-electro-mechanical systems (MEMS) devices, and the like. Wafer edge rings can also be utilized in multi-wafer semiconductor devices.

For wafer level chip scale packaging of MEMS devices, the wafer edge seal ring is important to protect a metal bond ring and a trench area during and/or after a bonding process. However, conventional wafer edge seal ring formation processes sacrifice surface treatment opportunities after the bonding process.

A conventional wafer edge seal ring fabrication process for forming the wafer edge seal ring is described below. In a first step, a wafer edge seal ring is defined by a photolithographic job setting or WEE process. The bonding layer is patterned by a general photolithography and etch procedure to form a closed loop metal ring around a wafer edge. In a second step, a wafer level hermetic seal is formed during a bonding process. After wafer bonding, remaining processes are performed to keep the wafer level hermetic seal. Therefore, additional surface treatments and/or coating processes can't be applied after bonding. In a third step, substrate material is thinned down by a grinding process. This could result in process gas contamination or wafer peeling and the like due to the pressure change in a vacuum and/or high temperature environment.

Figure 1:
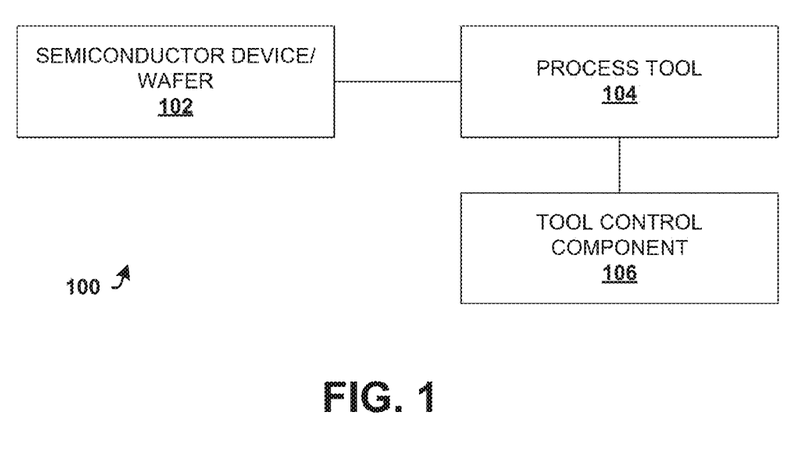
FIG. 1 is a block diagram illustrating a semiconductor device fabrication system.

FIG. 1 is a block diagram illustrating a semiconductor device fabrication system 100. The system 100 forms a wafer edge seal ring subsequent to a bonding process. Further, the system 100 permits surface treatment processes and the like after bonding.

The system 100 includes a process tool 104 and a tool control component 106. The system operates on a semiconductor device or wafer 102. The semiconductor device 102 can include multi-wafer devices, micro-electro-mechanical devices, and the like. For multi-wafer devices, multiple wafers can be stacked or bonded on top of each other and separated along scribe lines to form what is referred to as a three-dimensional integrated circuit. The device 102 can be partially formed and include an effective die area, trench areas, metal pad areas, and the like.

Figure 2A:
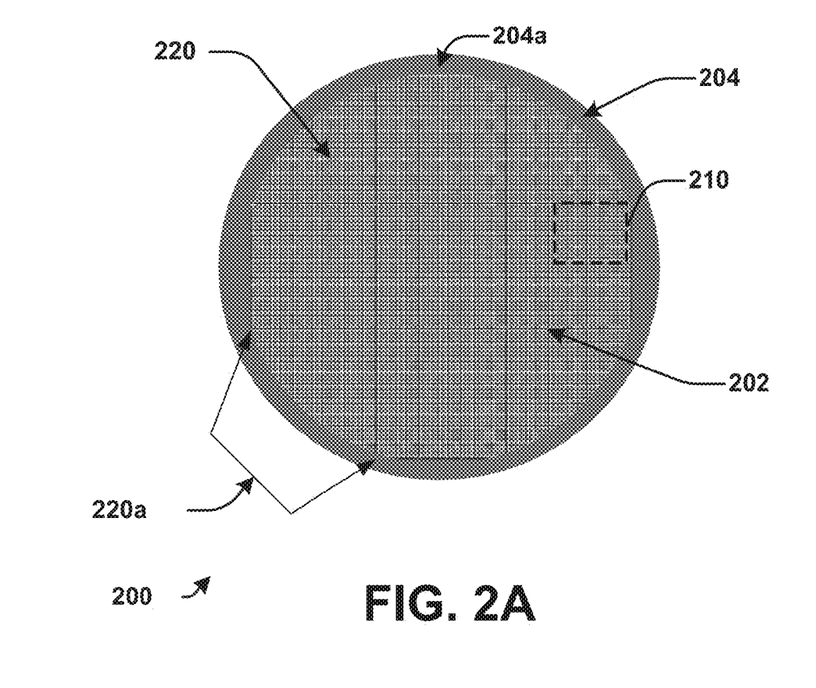
FIG. 2A is a diagram of an example semiconductor device that can be utilized with the semiconductor device fabrication system.
Figure 2B:
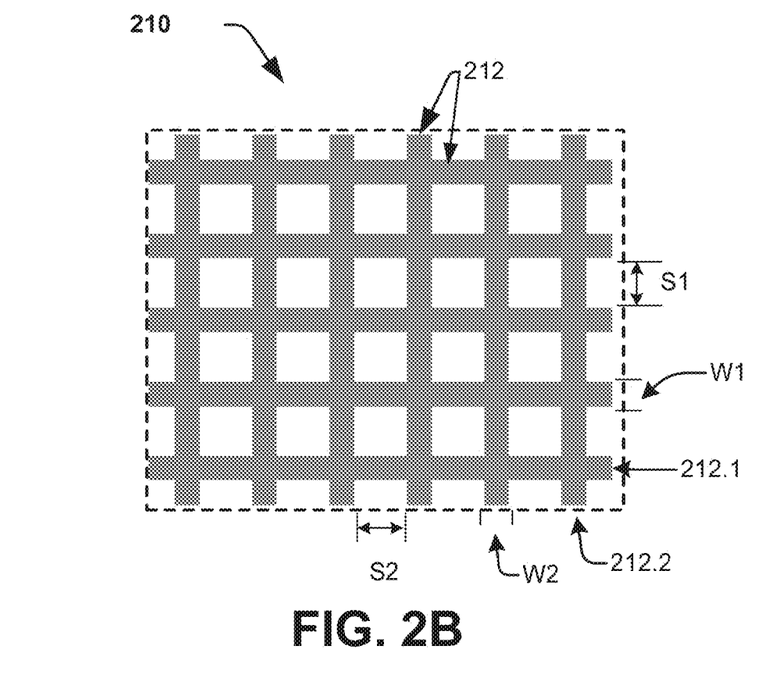
FIG. 2B illustrates a portion of the wafer edge seal ring.

FIGS. 2A and 2B illustrate an example semiconductor device having a seal ring. FIG. 2A is a diagram of an example semiconductor device 200 that can be utilized with the semiconductor device fabrication system 100. The device 200 can be utilized for the semiconductor device 102 of FIG. 1.

The device or wafer 200 is shown with a wafer seal ring 204 and an effective die area 202. The wafer edge seal ring 204 is shown on an outside edge of the device 200. The wafer edge seal ring 204 has a ring shape 204a, which can vary. However, the ring shape 204a is shown generally circular. The wafer edge seal ring 204 mitigates particulate contaminants and the like during fabrication and/or processing of the device 200.

The effective die area 202 includes dies 220 having one or more substrates, metal layers, trench areas, metal pads, a die level seal ring, and the like. Scribe lines (not shown) may be formed between the dies.

A portion 210 of the wafer edge seal ring 204 is indicated and is described in further detail below.

The device 200 is provided for illustrative purposes and to facilitate understanding. It is appreciated that systems and methods can include or operate on other suitable semiconductor devices.

FIG. 2B illustrates the portion 210 of the wafer edge seal ring 204. A pattern structure 212 can be utilized to form the seal ring 204. The pattern structure 212 includes first structure portions 212.1 and second structure portions 212.2. The first structure portions 212.1 are shown separated by a first spacing S1 and have a first width W1. The second structure portions 212.2 are shown separated by a second spacing S2 and have a second width W2. The first and second structure portions 212.1 and 212.2 are also referred to as lines.

The portion 210 and the wafer edge seal ring 204 are shown with a generally square or rectangular pattern. However, it is appreciated that other patterns and shapes are contemplated.

Returning to FIG. 1, the process tool 104 is configured to perform one or more semiconductor fabrication processes on the semiconductor device 102. It is appreciated that the process tool 104 encompasses one or more process tools for perform a variety of semiconductor fabrication processes and related components.

The tool control component 106 is configured to control the fabrication processes performed by the process tool 104. The control component 106 includes various process fabrication steps and control settings to perform processes to form selected devices, including, for example, the semiconductor device 102.

The tool control component 106 is configured to perform an edge sealing process that forms a wafer edge seal ring after a bonding process and permits adding surface treatment processes at a post bond stage. An edge trimming process is performed on a first side or substrate of the semiconductor device. The edge trimming process removes or trims an outer portion of the first substrate according to a width of the removed portion. The width has a suitable value greater than or equal to zero. Wafer bonding is performed to bond the first substrate to a second substrate without a wafer edge seal ring. The wafer bonding forms a device bond ring between the first and second substrates. During the bonding process, trench and/or tunnel areas are connected to a wafer edge atmosphere and only a portion of the device 102 is sealed by the device bond ring. One or more additional surface treatments or fill processes are performed on the trench and/or tunnel areas, which remain exposed. The surface treatment processes include self assembled monolayers (SAM) formation processes. The fill processes include forming and/or depositing fill material within the trench and/or tunnel areas.

Subsequent to the surface treatment and/or fill processes, an edge sealing material is applied under a selected process pressure to form wafer edge sealing and to protect inside wafer structures, including the trench and/or tunnel areas. Some examples of edge sealing materials include HDP, PR, Metal, and the like. Thereafter, a thin down process is performed on the first substrate to remove unwanted sealing material. The thin down process can be performed using a suitable technique such as etching back, stripping, grinding, and the like.

Additional details of a suitable seal ring formation process are provided in the methods and figures described below.

It is noted that the semiconductor device fabrication system 100 is provided as an example to facilitate understanding. The system 100 is provided in a simplified form to aid understanding and it is appreciated that variations in the system 100 are contemplated and permitted.

Figure 3:
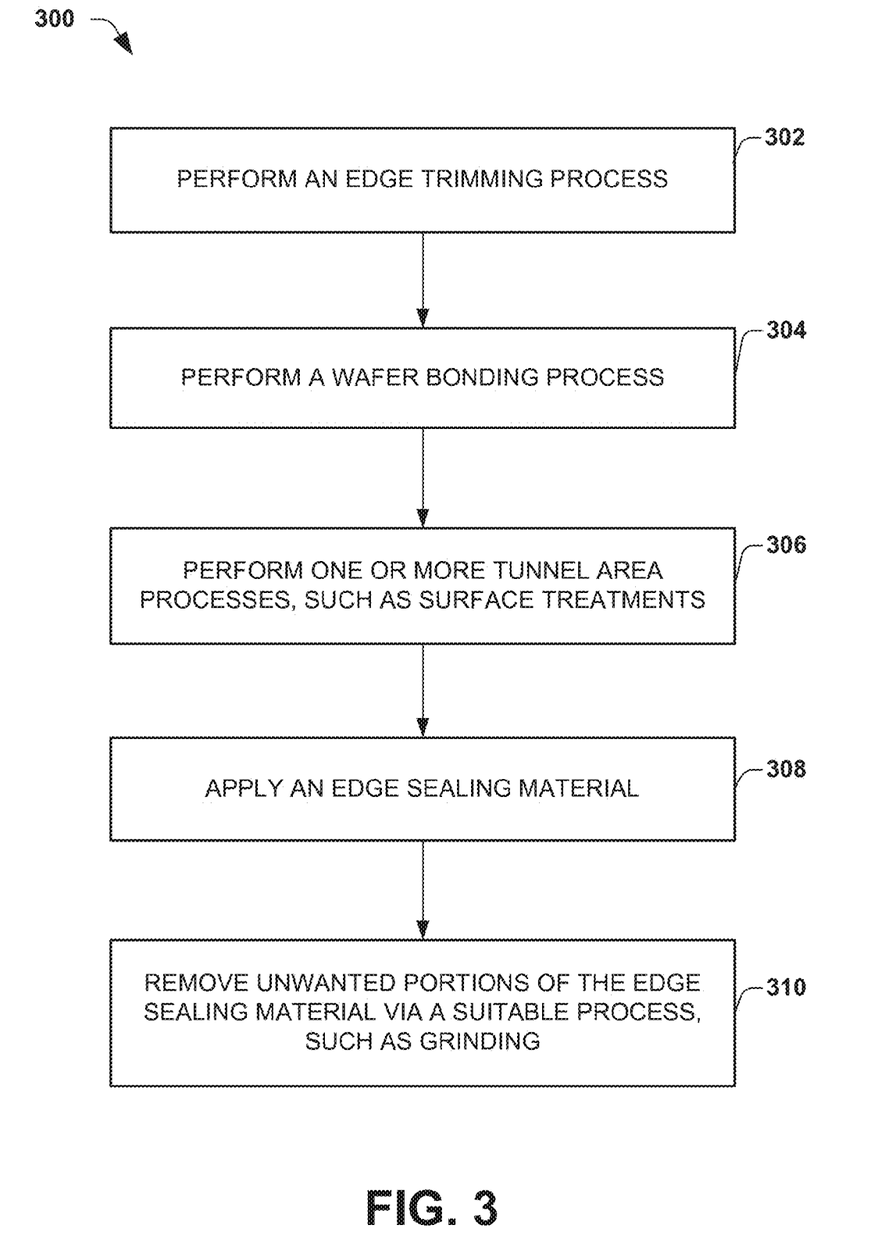
FIG. 3 is a flow diagram illustrating a method of forming a wafer edge seal ring after a bonding process.

FIG. 3 is a flow diagram illustrating a method 300 of forming a wafer edge seal ring after a bonding process. The method 300 permits processes to be performed on trench/tunnel areas after the bonding process. FIGS. 4-10 are referenced within the description of the method 300 to facilitate understanding. FIGS. 4-10 depict an example semiconductor device at various states of fabrication.

The method begins at block 302, wherein an edge trimming process is performed on a first side or substrate of a wafer/semiconductor device. The device is a multi-wafer or substrate device having a first substrate positioned over a second substrate. The edge trimming process is performed prior to a bonding process. The semiconductor device includes the first substrate and the second substrate. The semiconductor device includes a tunnel/trench area, metallization layers, inside region/device cavities, and the like. The tunnel/trench area includes metal pads.

An edge portion of the first substrate having a selected width is removed. The edge portion extends around an outer circumference of the first substrate. The width has a suitable value greater than or equal to zero.

The edge trimming process includes a suitable removal process, such as photolithography patterning. The process utilized can depend on which edge sealing process is used.

A wafer bonding process is performed at block 304 without a wafer edge seal ring. The wafer bonding process forms a bond ring that encloses inside cavities, but leaves other portions of the semiconductor device, including the trench/tunnel areas, exposed to atmosphere.

The wafer bonding process includes a suitable bonding process that adheres surfaces of the first substrate and the second substrate together and that forms the bond ring or rings.

Figure 4:
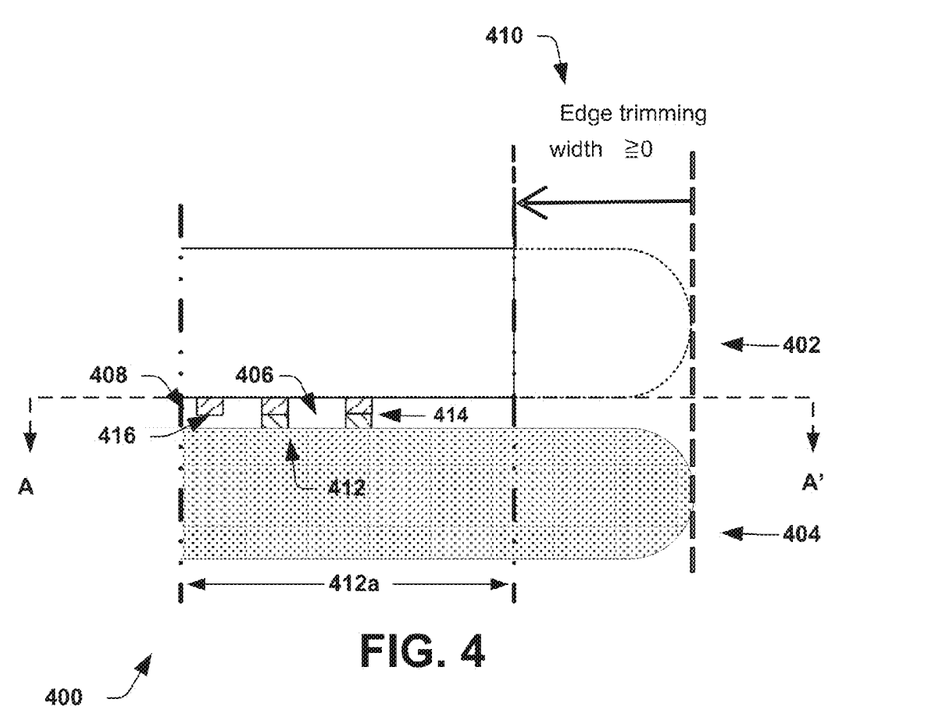
FIG. 4 is a cross sectional view of a semiconductor device after edge trimming and bond ring formation.

FIG. 4 is a cross sectional view of a semiconductor device 400 after edge trimming and bonded edge seal ring formation. The semiconductor device 400 includes a first substrate 402 and a second substrate 404. The device 400 includes a bonded seal ring 412 within a ring seal area 412a.

The ring 412 has upper and lower elements 414 formed and bonded together. The upper and lower elements comprise suitable materials, such as varied metal materials, such as Al, Cu, Ge, and the like. The ring 412 defines inside cavities, including an inside cavity 406. The ring area 412a also includes trench areas 408 and pad areas 416. An effective die area lies to the left of the ring area 412a.

A width 410 of the first substrate 402 has been removed at block 302. A bond ring 412 has been formed at block 304, thereby sealing the inside cavity 406. The trench/pad areas 408 remain exposed to atmosphere.

Figure 5:
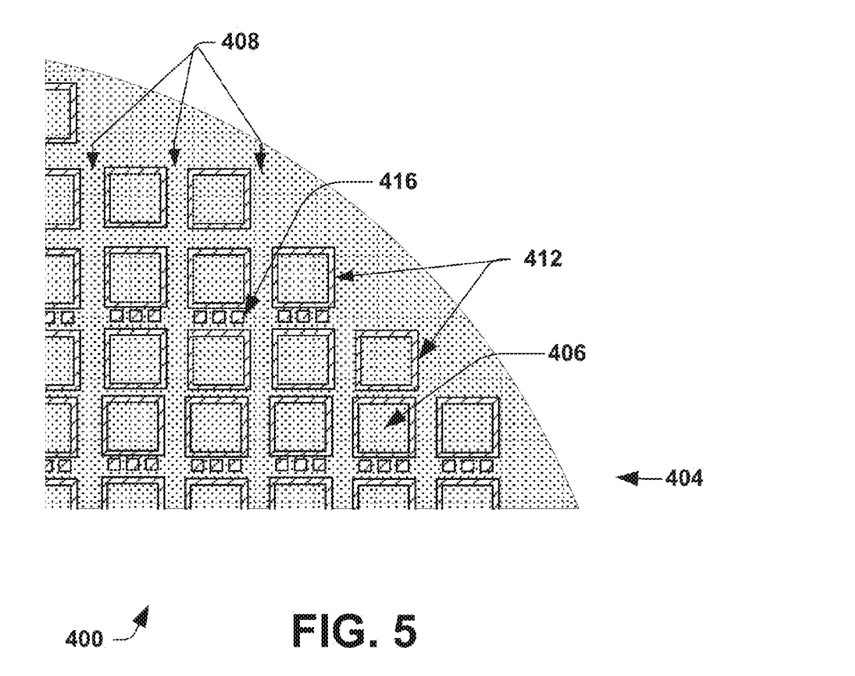
FIG. 5 is a top view of the semiconductor device after edge trimming and bond ring formation.

FIG. 5 is a top view of the semiconductor device 400 after edge trimming and bond ring formation. Here, an upper surface of the second substrate 404 is shown. The bonded ring 412, which is shown as a pattern of enclosed squares, is shown located near the periphery in this example. The trench/tunnel areas 408 and pad areas 416 are shown as indicated. Further, an inside cavity 406 is also shown.

Returning to the method 300 of FIG. 3, one or more tunnel area processes are performed at block 306. The tunnel area processes include additional surface treatments, fill processes, and the like. For example, the tunnel area processes can include self-assembled monolayers (SAM) coating. Generally, the tunnel area processes are not able to be performed after formation of an edge seal ring.

Figure 6:
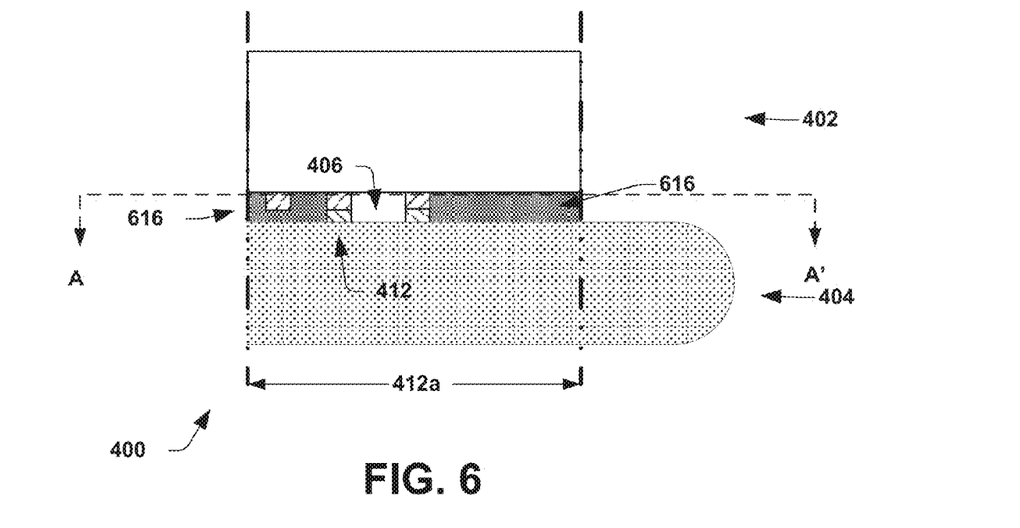
FIG. 6 is a cross sectional view of the semiconductor device after a surface treatment.

FIG. 6 is a cross sectional view of the semiconductor device 400 after a surface treatment. A surface treatment process has been performed on the device 400 according to block 306. A surface treatment gas or fill material 616 can be seen between the first substrate 402 and the second substrate 404. It can be seen that the inside cavity 406 is not subjected to the surface treatment.

Figure 7:
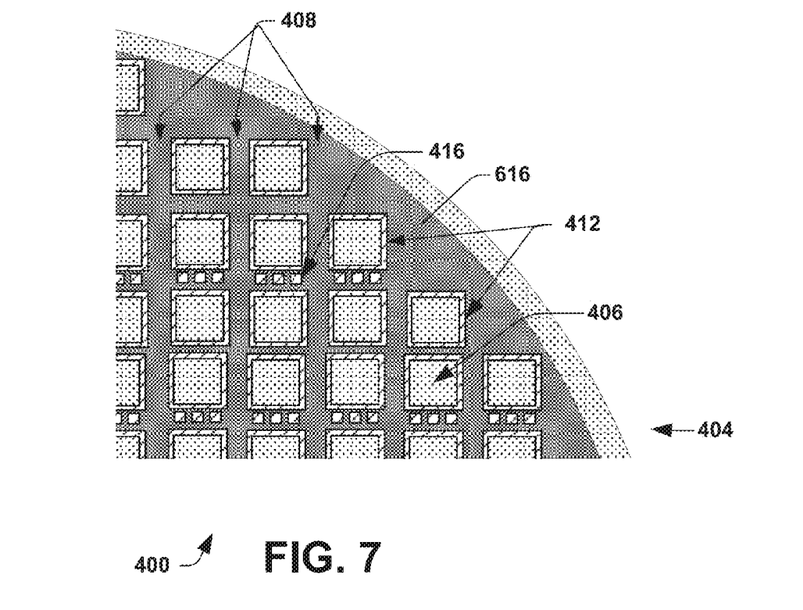
FIG. 7 is a top view of the semiconductor device after the surface treatment process.

FIG. 7 is a top view of the semiconductor device 400 after the surface treatment process. The second substrate 404 is again shown. The surface treatment gas or fill material 616 is shown as applied to the trench areas 408, pad areas 416 and other areas, but is not present in the inside cavity 406 due to the formed bond ring 412.

Returning to the method 300 of FIG. 3, an edge sealing material is applied to the device at block 308 using a wafer edge sealing process. The sealing process is performed after the tunnel area processes, including surface treatments, and forms an edge seal ring about a perimeter of the wafer. The edge sealing material is applied under a selected process pressure to form the edge seal ring. The edge seal ring protects inside portions of the device and mitigates contaminants or particles from entering the device. The edge seal ring is comprised of a suitable sealing material, such as HDP, PR, Metal, and the like.

Figure 8:
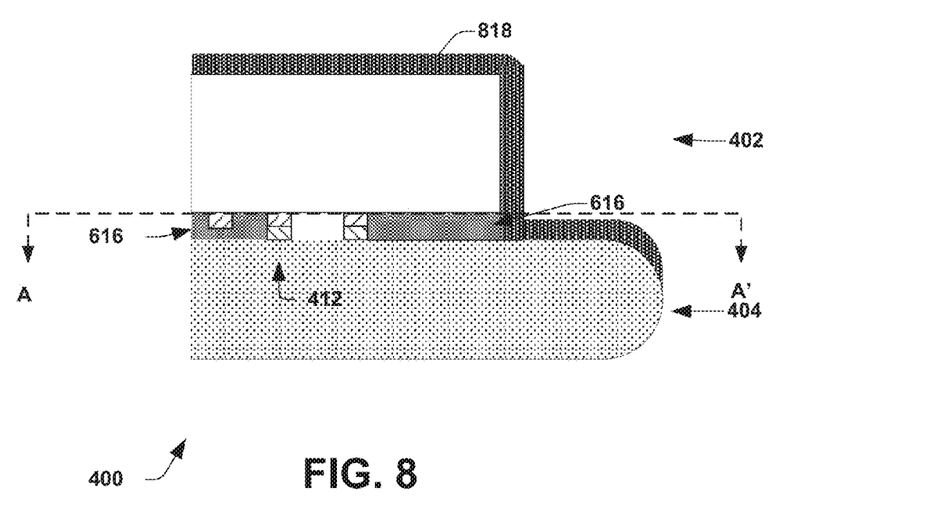
FIG. 8 is a cross sectional view of the semiconductor device after the wafer edge sealing process.

FIG. 8 is a cross sectional view of the semiconductor device 400 after the wafer edge sealing process. Here, it can be seen that an edge sealing material 818 is formed on upper surfaces of the first substrate 402 and portions of the second substrate 404. The edge sealing material 818 is blocked from portions between the first and second substrates 402 and 404.

Figure 9:
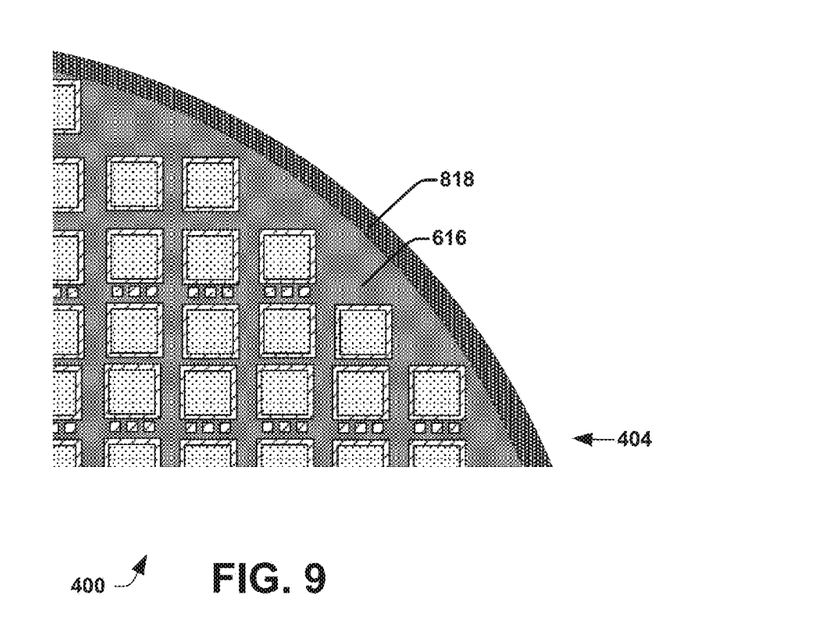
FIG. 9 is a top view of the semiconductor device after the wafer edge sealing process.

FIG. 9 is a top view of the semiconductor device 400 after the wafer edge sealing process. This view shows an upper side of the second substrate 404. The surface treatment or fill material 616 is still present. A portion of the edge sealing material 818 is shown on or about an outer edge of the second substrate 404.

Returning again to the method 300 of FIG. 3, an unwanted sealing material removal process is performed at block 310. The removal process removes portions of the edge sealing material, including an upper portion on the first substrate, from the semiconductor device. A suitable removal process, such as a thin down, etching back, strip, and the like can be utilized to remove the unwanted portion of the edge sealing material. In one example, a grinder is utilized in a grinding process to thin down the first substrate. Once removed, additional processes, including back end processes, can be performed.

Figure 10:
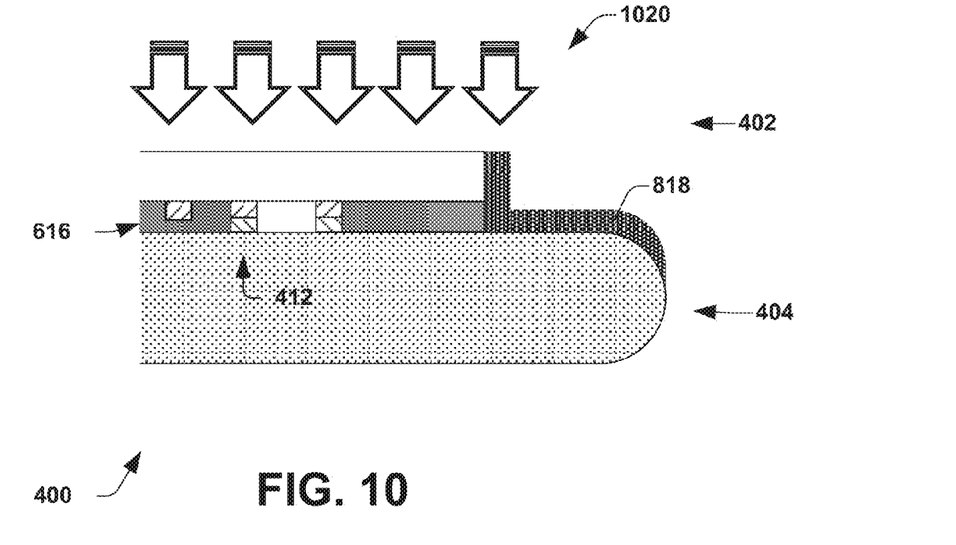
FIG. 10 is a cross sectional view of the semiconductor device after an unwanted sealing material removal process.

FIG. 10 is a cross sectional view of the semiconductor device 400 after an unwanted sealing material removal process. The sealing removal process 1020 as described in block 310 has been performed to remove an unwanted sealing material from an upper surface of the first substrate 402. Subsequently, additional processes, including back end processes can be performed on the device 400.

It will be appreciated that while reference is made throughout this document to exemplary structures in discussing aspects of methodologies described herein (e.g., the structure presented in FIGS. 4-10, while discussing the methodology set forth in FIG. 3), that those methodologies are not to be limited by the corresponding structures presented. Rather, the methodologies (and structures) are to be considered independent of one another and able to stand alone and be practiced without regard to any of the particular aspects depicted in the Figs.

A method for fabricating a semiconductor device is disclosed. A first substrate is arranged over a second substrate. A wafer bonding process is performed on the semiconductor device. First regions of the device are enclosed by the bonding process. Second regions of the device remain exposed. One or more processes are performed on the exposed second regions, after performing the wafer bonding process. The one or more processes include a fill process that forms a fill material within the exposed second regions. An edge seal material is applied on the first and second substrates after performing the one or more processes.

A method for fabricating a semiconductor device is disclosed. A semiconductor device is provided. The device has a first substrate bonded to a second substrate. First and second regions are between the first substrate and the second substrate. The first regions are enclosed. The second regions are exposed. A fill operation is performed between the first substrate and the second substrate. An edge sealing material is applied on the first and second substrates.

A semiconductor device is disclosed. The device includes a first substrate and a second substrate. A bond ring is formed between and connecting the first and second substrates. The bond ring defines exposed regions and enclosed regions. The exposed regions are at least partially filled with a material.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method for fabricating a semiconductor device, the method comprising:
   arranging a first substrate over a second substrate;
   performing a wafer bonding process, wherein first regions between the first substrate and the second substrate are enclosed and second regions are exposed to atmosphere;
   after performing the wafer bonding process, performing one or more processes on the exposed second regions, including a fill process that forms a fill material within the exposed second regions; and
   after performing the one or more processes on the exposed second regions, applying an edge sealing material on the first substrate and the second substrate.

2. The method of claim 1, further comprising performing an edge trimming process on the first substrate prior to performing the wafer bonding process.

3. The method of claim 1, further comprising removing unwanted portions of the edge sealing material from the first substrate.

4. The method of claim 1, wherein the wafer bonding process forms a bond ring between the first and second substrates.

5. The method of claim 1, wherein the second region includes trench areas and pad areas.

6. The method of claim 1, wherein the first region includes an inside cavity.

7. The method of claim 2, wherein the edge trimming process removes a selected width from an outside portion of the first substrate.

8. The method of claim 2, wherein performing the one or more processes on the exposed second region includes performing a surface treatment.

9. The method of claim 2, wherein performing the one or more processes on the exposed second region includes performing an additional fill operation.

10. The method of claim 1, further comprising performing a grinding operation.

11. The method of claim 1, wherein the semiconductor device is a MEMS device.

12. The method of claim 1, wherein the first and second substrates are first and second semiconductor wafers, respectively.

13. A method for fabricating a semiconductor device, the method comprising:

providing a semiconductor device having a first substrate bonded to a second substrate, wherein first regions between the first substrate and the second substrate are enclosed and second regions between the first substrate and the second substrate are exposed; and     performing a fill operation between the first substrate and the second substrate; and     applying an edge sealing material on the first substrate and the second substrate.

14. The method of claim 13, further comprising performing an edge trimming process on the first substrate before applying an edge sealing material.

15. The method of claim 13, wherein the second regions include trench areas.

16. The method of claim 13, wherein semiconductor device includes a MEMS device.

17. The method of claim 13, wherein the bonding process forms bond rings around the first regions.

18. The method of claim 17, wherein a bond ring circumscribes the first regions along a first axis and extends between opposing faces of the first and second substrates along a second axis to enclose the first regions and thereby define an inside cavity between the first and second substrates.

19. The method of claim 13, further comprising removing a portion of the edge sealing material from the first substrate.

20. The method of claim 13, wherein the first and second substrates are first and second semiconductor wafers, respectively.

\* \* \* \* \*

UNITED STATES PATENT AND TRADEMARK OFFICE
CERTIFICATE OF CORRECTION

PATENT NO. : 8,841,201 B2  
APPLICATION NO. : 13/771382  
DATED : September 23, 2014  
INVENTOR(S) : Yi-Chuan Teng et al.

Page 1 of 1

It is certified that error appears in the above-identified patent and that said Letters Patent is hereby corrected as shown below:

On the Title Page, Item (72) please correct Inventor 5's name from "Lin-Min Hung" to
--Li-Min Hung--

Signed and Sealed this
Sixteenth Day of December, 2014

Michelle K. Lee
*Deputy Director of the United States Patent and Trademark Office*